United States Patent
Hagen et al.

(10) Patent No.: US 7,714,582 B2
(45) Date of Patent: May 11, 2010

(54) CONNECTION DEVICE FOR CONNECTING ELECTRONICS OF A HEAD COIL ARRANGED ON A PATIENT SUPPORT TO A CONNECTOR LOCATION PROVIDED ON THE PATIENT SUPPORT

(75) Inventors: Jürgen Hagen, Erlangen (DE); Helmut Stark, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 287 days.

(21) Appl. No.: 11/882,682

(22) Filed: Aug. 3, 2007

(65) Prior Publication Data

US 2008/0030195 A1 Feb. 7, 2008

(30) Foreign Application Priority Data

Aug. 4, 2006 (DE) .................... 10 2006 036 574

(51) Int. Cl.
*G01V 3/00* (2006.01)
*G01R 33/483* (2006.01)
*G01T 1/164* (2006.01)

(52) U.S. Cl. .................. 324/322; 324/318; 324/307; 250/363.03

(58) Field of Classification Search ......... 324/300–322; 600/410, 411, 415, 422; 250/362, 363.01–363.05
See application file for complete search history.

(56) References Cited

U.S. PATENT DOCUMENTS

| 4,939,464 | A | * | 7/1990 | Hammer | 324/318 |
|---|---|---|---|---|---|
| 4,972,852 | A | | 11/1990 | Koob et al. | 600/415 |
| 5,065,760 | A | | 11/1991 | Krause et al. | 600/421 |
| 5,474,068 | A | | 12/1995 | Takamori | 600/410 |
| 6,122,541 | A | * | 9/2000 | Cosman et al. | 600/426 |
| 6,246,900 | B1 | * | 6/2001 | Cosman et al. | 600/426 |
| 7,126,126 | B2 | * | 10/2006 | Schyler et al. | 250/363.03 |
| 7,286,867 | B2 | * | 10/2007 | Schlyer et al. | 600/407 |
| 7,626,389 | B2 | * | 12/2009 | Fiedler et al. | 324/309 |
| 2005/0082486 | A1 | * | 4/2005 | Schlyer et al. | 250/363.01 |

(Continued)

FOREIGN PATENT DOCUMENTS

DE 39 35 082 1/1991

(Continued)

OTHER PUBLICATIONS

A German Search Report issued in a corresponding German Application on Dec. 5, 2007.

(Continued)

*Primary Examiner*—Brij B. Shrivastav
*Assistant Examiner*—Tiffany A Fetzner
(74) *Attorney, Agent, or Firm*—Harness, Dickey & Pierce, P.L.C.

(57) ABSTRACT

A connection device is provided for connecting electronics of a head coil arranged on a patient support to a connector location provided on the patient support, the head coil being insertable into a PET detector arranged in a magnetic resonance instrument so that simultaneous magnetic resonance and PET recording is possible. In at least one embodiment, the connection device includes a cable connection with at least one releasable device for attachment to the electronics and the connector location, wherein the cable connection is fed from the electronics through the annular PET detector and externally on the PET detector back to the connector location.

22 Claims, 6 Drawing Sheets

U.S. PATENT DOCUMENTS

| | | | |
|---|---|---|---|
| 2005/0113667 A1* | 5/2005 | Schlyer et al. | 600/411 |
| 2007/0102641 A1* | 5/2007 | Schmand et al. | 250/363.03 |
| 2008/0030195 A1* | 2/2008 | Hagen et al. | 324/322 |
| 2008/0068017 A1* | 3/2008 | Eberler et al. | 324/318 |
| 2008/0230704 A1* | 9/2008 | Daghighian | 250/363.03 |
| 2008/0284428 A1* | 11/2008 | Fiedler et al. | 324/307 |
| 2009/0206836 A1* | 8/2009 | Eberler et al. | 324/307 |

FOREIGN PATENT DOCUMENTS

EP   0 161 340   11/1985

OTHER PUBLICATIONS

Marsden P. K., et al., Simultaneous PET and NMR, The British Journal of Radiology, 75, 2002, S.S53-S59; Others.

* cited by examiner

CONNECTION DEVICE FOR CONNECTING ELECTRONICS OF A HEAD COIL ARRANGED ON A PATIENT SUPPORT TO A CONNECTOR LOCATION PROVIDED ON THE PATIENT SUPPORT

PRIORITY STATEMENT

The present application hereby claims priority under 35 U.S.C. §119 on German patent application number DE 10 2006 036 574.7 filed Aug. 4, 2006, the entire contents of which is hereby incorporated herein by reference.

FIELD

Embodiments of the invention generally relate to a connection device, such as one, for example, for connecting electronics of a head coil arranged on a patient support to a connector location provided on the patient support, the head coil being insertable into a PET detector arranged in a magnetic resonance instrument so that simultaneous magnetic resonance and PET recording is possible. Further, the connection device may include a cable connection with a releasable means for attachment to the electronics and the connector location.

BACKGROUND

Both magnetic resonance tomography (MRT) and positron emission tomography (PET) are imaging methods which are suitable for representing the interior of the human body or, especially in the case of PET, for representing biochemical processes in the body. Very recently, there has been interest in combining MRT and PET in one instrument, so that both imaging modes can be employed simultaneously or in quick succession on the same patient.

To this end it has been proposed additionally to provide an optionally removable PET detector inside a magnetic resonance system's conventional magnet arrangement including the base field magnet and gradient coils, optionally as well as a whole-body radiofrequency coil. Such usually replaceable PET detectors are provided in particular for head recordings. The PET detector is enclosed on the outside by a radiofrequency shield. A local coil, in particular a head coil which is also intended to enclose the patient's head, is also provided inside the PET detector during the measurement. This head coil is usually fastened on a patient support and may be operated as a pure transmit coil or as a transmit/receive coil. A patient lying on the patient support, whose head has already been placed inside the head coil, is accordingly moved into the magnetic resonance system and therefore simultaneously into the PET detector ring for the measurement.

The region inside the PET detector, which is moreover designed as a detector ring, should substantially be kept free of materials in order to avoid attenuation and image noise-generating deflection of the PET radiation.

In order to operate the head coil which includes associated electronics, however, it is necessary to connect them to a corresponding connector location arranged on the patient support. Many possibilities are known in respect of this connection, but all of them entail disadvantages.

Some of the terminology used in this application relating to the directions along the longitudinal axis (so-called z axis) of the magnetic resonance system, i.e. the longitudinal axis of both the PET detector and the patient support, will first be established. When a patient is arranged properly on the patient support, their head lies on one side of the patient support and their feet on the other side of the patient support. The direction in which the patient's head points in such an arrangement will be referred to below as "head side". The opposite direction will be called "foot side".

In order to connect the head coil to the connector location via a cable connection with at least one releasable attachment device for the electronics and for the connector location, it has been proposed to arrange the coil electronics on the foot side. Although this would avoid additional material being introduced inside the PET detector ring, the electronics are however then arranged over the patient's chest and therefore interfere with their freedom to breathe, so that the patient feels constricted. Fitting the electronics in the region of the patient's neck is likewise found to be inexpedient since recordings are often intended to be made in the cervical vertebra region as well.

Another solution proposes to divide the electronics. Such a head coil or other local coil often consists of a plurality of independently drivable coil elements, to which separate electronics can respectively be assigned. In said case, the electronics may be arranged partially on the posterior side and partially on the chest side. This, however, disadvantageously requires a plurality of cables which are furthermore difficult to access. Especially for heavier patients, exacerbated problems with space are then encountered. Other disadvantages which may be mentioned are large voltage interference through the head coil in the kV range, coupling and distortion of the magnetic fields, susceptibility to vibration and instabilities of the receive coil elements.

For this reason, many head coils are designed so that the electronics are arranged on the head side. The cable connection is then fed through the PET detector and therefore through the radiofrequency field region of the coils. At least one device is, in this case, provided for suppressing the radiofrequency effects, for example surface wave filters, radiofrequency chokes or the like. Nevertheless, the cable connection in the radiofrequency field nevertheless leads to coupling and distortion, so that the symmetry is also broken. The high induced voltages and feedbacks can lead to vibrations and instabilities. Matching furthermore becomes difficult, and decoupling the individual coil elements is complicated. Lastly, in this case it is necessary to arrange additional material inside the annular PET detector, so that attenuation and image noise can occur.

SUMMARY

In at least one embodiment, the invention provides a connection device for connecting electronics of a head coil arranged on a patient support to a connector location provided on the patient support, which avoids at least one of the disadvantages as much as possible.

In at least one embodiment, the invention proposes that the cable connection should be fed from the electronics through the annular PET detector and externally on the PET detector back to the connector location.

At least one embodiment of the invention therefore does not propose to feed a cable connection from the head coil's electronics arranged on the head side to the connector location on the patient support through the head coil and the PET detector itself, rather the cable connection, which is connected on the head coil side via at least one suitable attachment device to the electronics arranged on the head side, is fed out from the PET detector on the head side, describes essentially a 180° arc in a turnaround region and is fed back externally on the PET detector from the head-side end of the PET detector to the foot-side end of the PET detector, where the at least one releasable attachment device is connected to the corresponding connector location lying on the patient support. With such cable routing, it is necessary to ensure that the patient support and with it the head coil and its electronics can be moved over a certain distance. A sufficient length of the cable connection must therefore be provided, in order to be able to compensate for the corresponding movement range.

Advantageously, space for electronics is therefore required on the foot side of the head coil so that all the free space remains available to accommodate the patient. Patients with a greater bodyweight can therefore also be examined, without there being any restriction of their freedom to breathe.

Furthermore, the cable connection is not fed through the radiofrequency field of the head coil, so that field couplings and field distortions are avoided. The radiofrequency transmit field therefore remains unperturbed and the coupling between the individual head coil elements is not changed. The highly sensitive receive electronics do not need to be safeguarded against induced voltages in the kV range. Feedbacks due to radiation of the amplified signals back into the head coil, with risk of oscillation, are furthermore avoided. Lastly, elaborate voltage-proof decoupling measures such as surface wave filters and radiofrequency chokes are also no longer necessary.

The relevant region of the PET detector is also not filled with additional material, so that no further attenuation and no further image noise in the PET imaging occur. A short measurement time can thereby be achieved.

A simpler structure of the head coil is therefore also possible in respect of its coil elements, since the region of the radiofrequency fields remains unperturbed and additional fine tunings are therefore not necessary.

The outer surface of the PET detector does not generally lie flush with the inner cladding of a magnet of the magnetic resonance system. There is for example an intermediate space of about 2.5 cm there, through which the cable connection can readily be fed.

Expediently, at least one guide device establishing the route of the cable connection is provided. Such at least one guide device will for example prevent the cable from "sagging" or following an undesired path locally or over the entire cable guide length. For example an in particular tubular, geometrically stable guide device at least partially enclosing the cable connection may be provided as the at least one guide device. The cable connection will therefore be fed through the geometrically stable guide device, at least in sections. This may in particular be a tube which is flexurally stiff and inside which the cable connection extends. It is however also conceivable to use for example holders separated from one another, which either engage around the cable connection or are designed as plug-in or clamping holders. Overall, a fixed layout can be specified which determines the route of the cable connection.

The connection device may expediently comprise at least one in particular telescopable carrier element for holding the at least one guide device and/or the cable connection. If the carrier element is telescopable, then the connection device may be converted into a space-saving shape, for example when a head coil is not needed or the PET detector itself is removed. Telescopability of the at least one guide device or displaceability of the at least one guide device may optionally also be provided in such a case, so that it can so to speak be retracted together with its carrier, in order that a particular cable section of flexible cable connection is left free. In such a case as well, the connection device is for example removable and compactly storable.

According to one embodiment of the invention, the cable connection may be fed over a return roll, in particular preloaded with a restoring force, in the turnaround region. Such a return roll may, for example, turn the cable connection around on the head side of the PET detector so that it can be fed back. A means for producing a restoring force may be provided in order to keep the cable connection under tension, in particular a spring or the like, against which the return roll is preloaded in the head-side direction so that the cable connection is held taut. In such a configuration, which is distinguished in particular by very straightforward production, the return roll has a diameter somewhat greater than the difference between the outer radius of the annular PET detector and the inner radius of the PET detector.

It is therefore possible for the cable connection to be fed past the inside and outside of the PET detector when the patient support is moved, without collisions taking place. In this case the cable connection is particularly advantageously relieved of tensile stress in the region of the connector location, or the electronics. This is for example possible simply by fixing the cable connection, for example by means of a clamping device which is provided on the patient support. Such tensile stress relief, however, may of course also be provided for the other embodiments of the present invention.

The route of the cable in such an embodiment may, for example be described as a trombone slide, the reverse bend being established by the return roll in the turnaround region and the cable connection being fed past both sides of the PET detector. A similar layout can be achieved if the cable connection is fed in at least two subsections parallel to the longitudinal axis of the PET detector, so that the subsections are fed along the PET detector when the patient support is moved.

In such an embodiment, the at least one guide device may be provided which ensure a straight route of the cable connection in addition or as an alternative to the restoring force. Something similar may, for example, be achieved by the aforementioned tubular at least one guide device. The cable connection may in particular be fed in such guide means over the entire range of the aforementioned resulting trombone slide, so that a rigid structure is obtained overall. This rigid structure may, for example, then be supported by a carrier element. The cable connection and the at least one guide device are therefore easily fed past the PET detector when the patient support is moved. It is in this case particularly expedient for the length of the subsections to be determined as a function of the maximum movement range of the patient support. The patient support can then be moved collision-free and without impediment over its entire latitude of movement.

In particular, embodiments may be envisaged in which the electronics of the head coil are essentially separated into two subunits. A cable connection must then be fed from each of these two subunits to a corresponding connector location. This may be achieved in the context of at least one embodiment of the invention for example by a symmetrical arrangement, such a trombone slide respectively being fed around the PET detector on its left- and right-hand sides. A T-shaped carrier may then be suitable as a carrier element, on which the at least one guide device or return rolls or the cable connection itself are held.

The example embodiments mentioned so far, in which the route of the cable is similar to a trombone slide, entail a relatively rigid structure of the connection device so that in particular the region of the reverse bend, the turnaround region, can be moved out from the head-side end of the magnetic resonance system when the patient support is inserted. Now, however, it may be the case that sufficient space or storage area is not available there for the connection device. At least one device, in particular at least one return roll, may for example therefore be provided for receiving and feeding the cable connection moved with the patient support in a direction essentially perpendicular to the longitudinal axis of the PET detector. Thus, a return device is provided, into which the cable connection and optionally the at least one guide device are moved so that the in particular sufficiently flexible cable connection is fed in a different direction, for example upward, so as to save space lengthwise overall.

This process may of course be initiated by other devices, and in particular the cable connection may be turned once more after reaching the inner cladding of the magnet, for example again through 90°, using another device, in particular further return rolls or rollers, so that the cable connection is fed again in the direction of the longitudinal axis of the PET detector after this second turnaround when the patient support is displaced. Turning through 180°, i.e. downward in the example, would also be conceivable given sufficient flexibility of the cable connection and optionally of the at least one guide device.

In an example embodiment, at least one stationary cable drum is provided for receiving or releasing the cable connection when the patient support is moved. This cable drum is preloaded in a corresponding rotation direction by using a device for producing a restoring force, for example a spring, so that the cable connection is on the one hand is tensioned and on the other hand rolled up automatically when the patient support is correspondingly moved. The cable connection is in particular fastened on the cable drum in the region of the reverse bend, so that the straight subsections can be wound up simultaneously. This solution does not entail a cumbersome trombone slide, rather the cable connection is rolled up in a space-saving fashion. Naturally, the cable connection must have suitable flexibility. In particular, tensile stress relief of the cable is also to be recommended in this example embodiment.

In all the or possible embodiments, when configuring the cable connection and at least one guide device, it is respectively necessary to observe mechanical tolerances to which the elasticity of the connection device should be adapted. In a version with the trombone slide shape, for example, the guide points and the curve stability of the trombone slide should correspondingly be selected so that minor mechanical tolerances cannot lead to breaking or other damage.

Furthermore, at least one embodiment of the present invention also relates to an annular PET detector including at least one connection device. In particular, such a PET detector may be mobile so that it is fitted into a magnetic resonance system only as and when required.

The connection device and the PET detector are in this case integrated to form one unit. If, for example, a mobile PET detector is thus provided which can be removed from the patient compartment of the magnetic resonance system or inserted by using corresponding devices, then the connection device, since it is only in fact needed when the PET detector is fitted, may accordingly also be removed with it.

For example, the PET detector with the connection device may be insertable into the patient compartment of the magnetic resonance system on guide rails. In this version, in particular the embodiments with space-saving accommodation of the connection device prove expedient. For example, if the carrier or the entire layout are designed to be telescopable, the connection device may correspondingly be retracted to a smaller area, in which case the PET detector may be removed from the patient compartment. Then, of course, the connections between the at least one attachment device and the connector location or the electronics are also to be designed as readily releasable, as are other components optionally to be fastened on the patient support, for example the carrier element. The mobile PET detector may then, for example, be extracted from the patient compartment and placed on a trolley. Once the magnetic resonance system no longer contains a PET detector, the usual connection device for the head coil, which is known from conventional magnetic resonance systems, may be used while the connection device of at least one embodiment of the present invention, as part of the PET detector, remains with the PET detector outside the magnetic resonance system until PET and MRT recordings are again intended to be made.

Expediently, the cable connection and/or at least one guide device may be fed in a static or sliding fashion in at least one guide fastened on the outer and/or inner surface of the detector. Such positioning of guides on the detector itself is directly advantageous since the cable connection is actually intended to be fed past the detector when the patient support is moved. In this case, for example when a preloaded cable connection is for example intended to be fed onto a cable drum, the cable connection itself may be fed along the PET detector in a suitable sliding guide. If, for example, the layout is established in the form of a trombone slide and the cable connection is enclosed by at least one tubular guide device at least over straight subsections, then the guide means itself may be fed along the PET detector. The guide may either extend over the entire length of the annular PET detector or be provided only point-wise, for example by supporting hooks. If only the foot-side part of the PET detector is used for the actual data recording, for example, then an elongate guide may also be fitted inside the PET detector.

In a particularly advantageous embodiment, at least one stationary cable drum may be provided on the end side of the PET detector for receiving or releasing the cable connection, in particular preloaded with a restoring force, when the patient support is moved. The cable drum is then provided directly on the PET detector so that no further space is required, over which the cable connection is tensioned. The rolling up of the cable connection already takes place directly on the PET detector. To this end, the cable connection is in turn fastened on the cable drum which is preloaded, for example by a suitable spring, so that the cable connection is rolled up automatically when the patient support is moved. The removal of a mobile PET detector becomes particularly straightforward in such a case, since the cable connection is actually rolled up automatically and there are no cumbersome, particularly protruding parts of the PET detector with a connection device. Here, the attachment means are merely released and optionally freed from a tensile stress relief means on the patient support. The PET detector can then be removed easily.

Lastly, at least one embodiment of the invention also relates to a magnetic resonance system including a magnet, a patient support which can be moved into a patient compartment and a PET detector according to at least one embodiment of the invention fastened in the patient compartment. In this case a permanently installed PET detector is provided, which is removed only for maintenance purposes.

In such a magnetic resonance system, at least one stationary cable drum may be provided on a cladding of the magnet for receiving or releasing the cable connection, in particular preloaded with a restoring force, when the patient support is moved. The cladding of the magnet is also suitable for fastening such a cable drum.

If the patient support includes a patient table which can be moved relative to a table carriage, the local coil being fastenable on the patient table and a connector location being provided on the table carriage, then it is expedient for the cable connection to include a loop in the region of the connector location to compensate for movements of the patient table relative to the carriage. The movement of the patient table relative to a carriage can also be compensated for by way of this loop.

BRIEF DESCRIPTION OF THE DRAWINGS

Other advantages and details of the present invention will be found in the example embodiments described below and with the aid of the drawings, in which.

DETAILED DESCRIPTION OF THE EXAMPLE EMBODIMENTS

The terminology used herein is for the purpose of describing particular embodiments only and is not intended to be limiting of the present invention. As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referencing the drawings, wherein like reference numerals designate identical or corresponding parts throughout the several views, example embodiments of the present patent application are hereafter described. Like numbers refer to like elements throughout. As used herein, the terms "and/or" and "at least one of" include any and all combinations of one or more of the associated listed items.

Figure 1A:
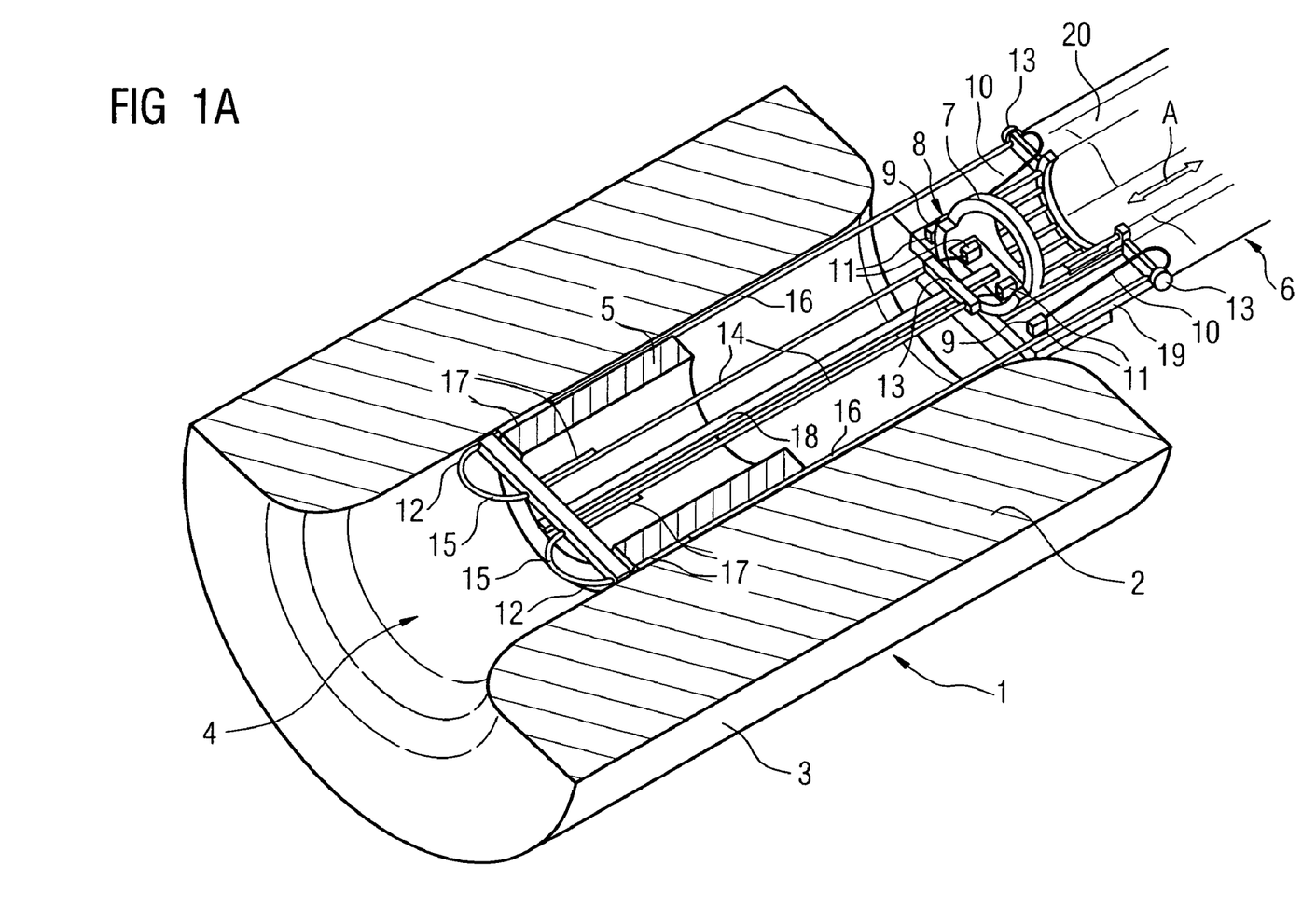
FIGS. 1A and 1B show an outline sketch which shows a section through a magnetic resonance instrument according to a first embodiment, respectively with the patient support extracted and inserted.
Figure 1B:
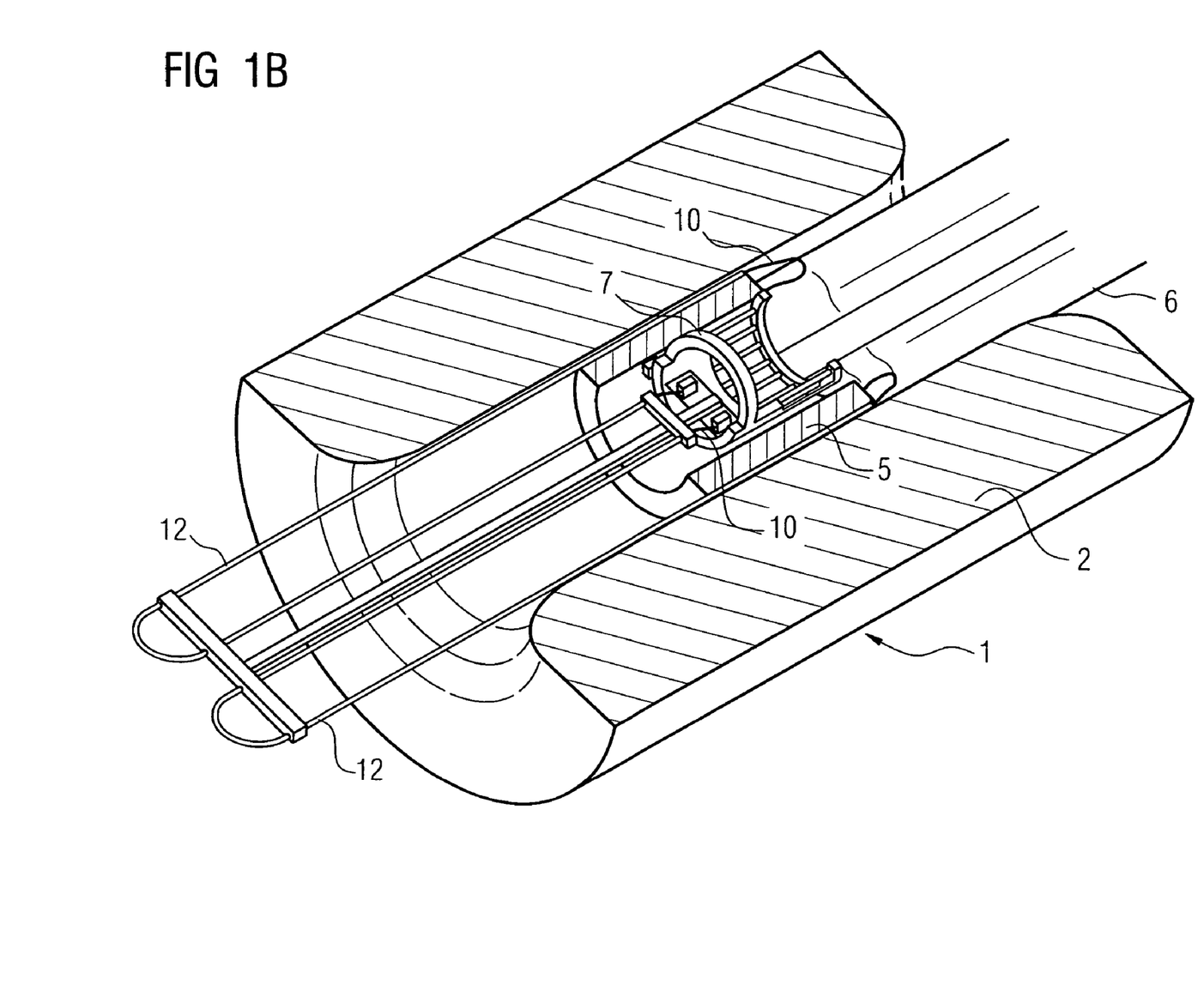

FIG. 1 shows a magnetic resonance system 1 which includes a magnet 2 with a cladding 3 (represented only in outline here). The same applies for the annular PET detector 5 arranged inside the patient compartment 4. The magnetic resonance system furthermore comprises a patient support 6, on which a head coil 7 is arranged. The head coil 7 comprises electronics 8, which are divided into two subunits and are provided with corresponding connections.

The patient support 6 furthermore includes connector locations 9, to which local coils such as the head coil 7 can be connected. As indicated by the arrow A, the patient support 6 is designed to be mobile along the longitudinal axis of the patient compartment 4 or the PET detector 5, so that it can be moved into the patient compartment 4. In order to connect the electronics 8 to the connector locations 9, a connection device is provided which includes two cable connections 10 for connecting the respective subunits of the electronics 8 to the connector locations 9. The cable connections 10 are provided with at least one releasable device 11 for attachment to the electronics 8 and the connector location 9.

The cable connections are partially fed through at least one tubular guide device 12. As can be seen, the guided region corresponds somewhat to a trombone slide, the cable connection 10 being fed from the electronics 8 through the annular PET detector 5 and externally on the PET detector 5 back to the connector location 9. The cable connection 10 is in this case initially free from the electronics-side attachment device 11 to a fastening device 13 for tensile stress relief. The electronics-side fastening device 13 forms the point where the trombone slide begins. From there, the cable connections 10 have their route established by the tubular guide device 12. The cable connection is first fed in a subsection 14 parallel to the longitudinal axis of the PET detector 5. This is followed on the head side by a U-shaped reverse bend 15. A straight subsection 16 in turn follows this, in which the cable connection 10 is fed parallel to the longitudinal axis of the PET detector 5 but in this case back on the outside of the PET detector 5, and therefore between the outer surface of the PET detector 5 and the cladding 3.

Overall, the straight subsections 14 and 16 and the reverse bend 15 lead to the shape of a trombone slide.

The straight subsection 16 ends at a connector location-side fastening device 13, from which the cable connection 10 extends freely to the connector location-side attachment device 11.

As a result, the cable connection 10 is therefore fed in the guide device 12 along the PET detector 5 when the patient support 6 is moved. To this end guides 17 (only indicated here) are provided on the PET detector 5, which hold the connection device and feed it past the PET detector 5. To further support the weight of the cable connection 10 or the guide device 12, a T-shaped carrier element 18 is provided on which the guide device 12 is fastened respectively in the region of the reverse bend 15.

While FIG. 1A shows the patient support 6 when it is extracted, FIG. 1B shows the patient support 6 when it is inserted. The head coil 7 now lies inside the PET detector 5.

As can be seen, the connection device feeds the cable connection 10 by way of the guide device 12 so that no part of the cable connection 10 is fed through the region relevant for the measurement, which is also the radiofrequency field region here. Interfering effects can therefore advantageously be avoided.

As can furthermore be seen from FIG. 1A, the patient support 6 includes a carriage 19 on which the connector locations 9 are arranged, as well as a patient table 20 which can be moved relative to the carriage 19. The section of the cable connection 10 lying free on the connector location side is therefore somewhat longer, so as to create a loop as represented in FIG. 1B when the patient table 20 is displaced.

It can likewise be seen in FIGS. 1A and 1B that the length of the straight sections 14 and 16 is adapted according to the maximum possible movement range of the patient support 6. When the patient support 6 lies in its maximally extracted position (FIG. 1A), then it can be seen that the T-shaped carrier element 18 just touches the head-side end of the PET detector 5.

The PET detector 5 represented here—and also that of the example embodiments yet to follow—may be a permanently installed PET detector 5. It is however also possible for the PET detector 5 to form an accessory which is inserted into the patient compartment 4 only when PET recordings are planned. Then, the connection device is advantageously connected permanently to the PET detector 5 and forms part thereof, since it is needed only when the PET detector 5 is also needed.

If the PET detector 5 is such a mobile detector, then the carrier element 18 and the guide device 12 in the straight regions 14 and 16 are advantageously designed to be telescopable so that the area occupied by the connection device can be shortened. The mobile PET detector 5 may then be stored in a space-saving fashion.

With a view to a consistent, comprehensible description, the same components will be provided with the same references in the following example embodiments.

Figure 2A:
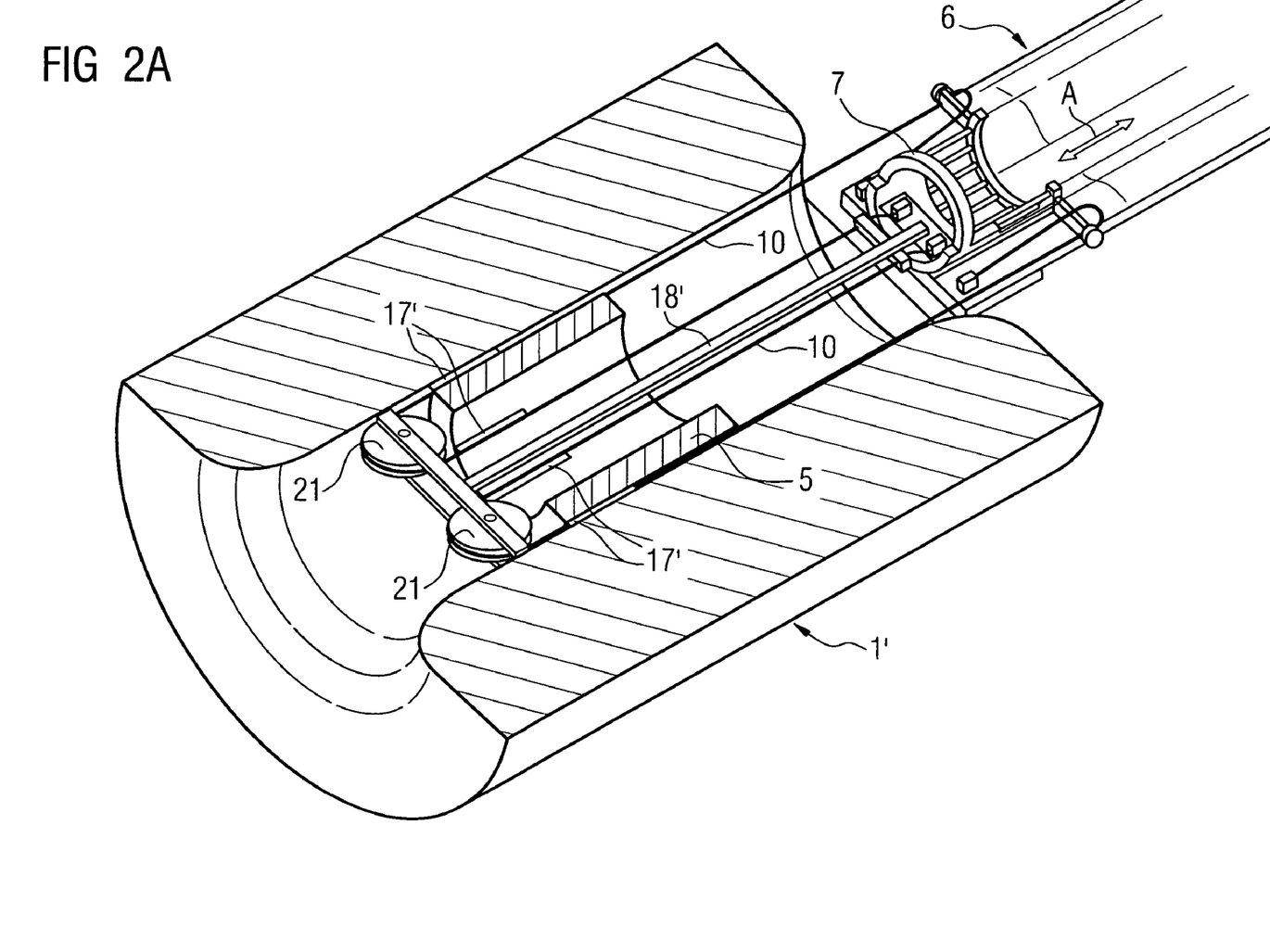
FIGS. 2A and 2B show an outline sketch which shows a section through a magnetic resonance instrument according to a second embodiment, respectively with the patient support extracted and inserted.
Figure 2B:
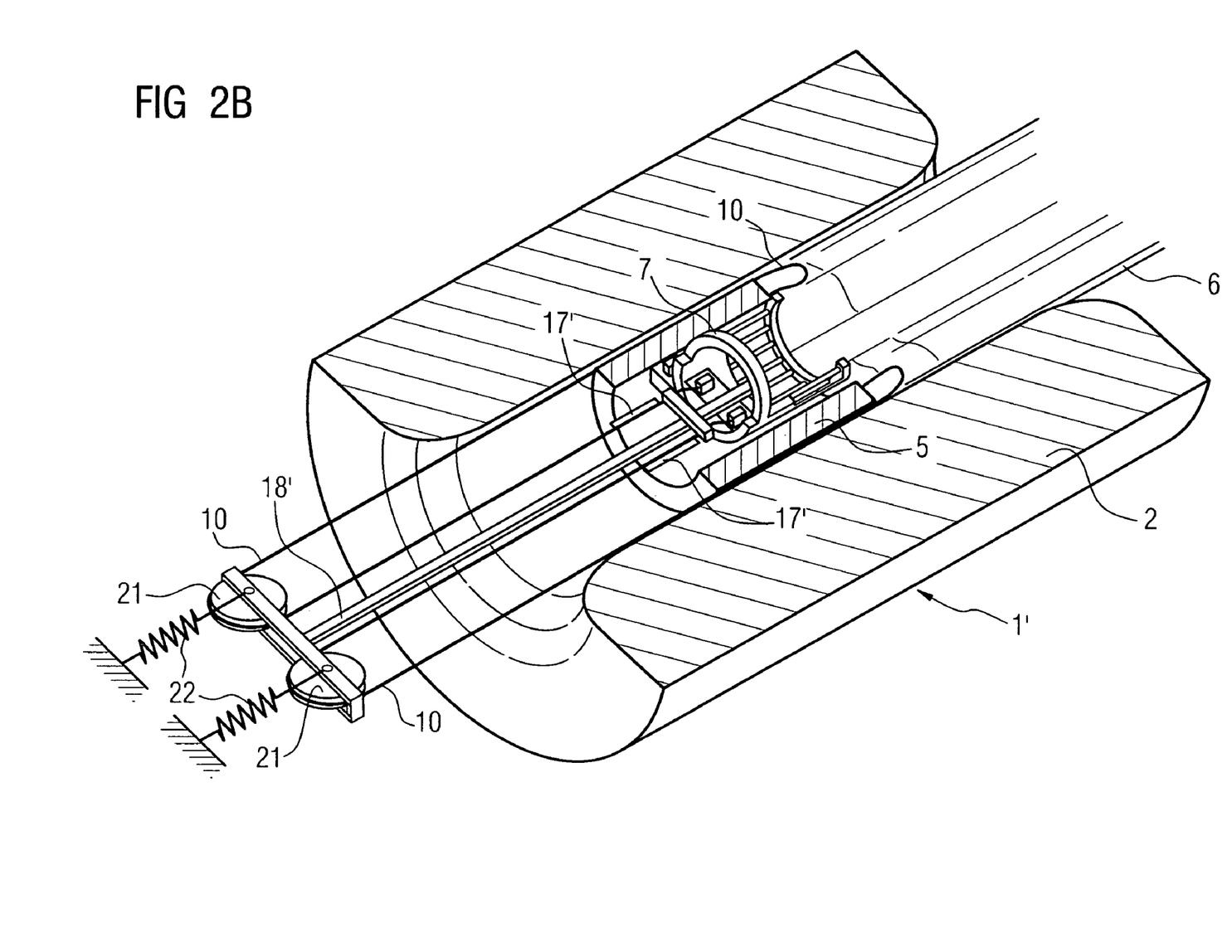

FIGS. 2A and 2B show a slightly modified embodiment of a magnetic resonance system 1'. As can be seen, a tubular guide device is not provided here, rather the cable connection 10 lies free over the entire extent and is fed over a return roll 21 arranged on the head side, which is respectively fastened on the T-shaped carrier element 18'. The return rolls 21 are therefore used as guide device here. The reference 22 denotes a device for producing a restoring force, which preloads the return rolls 21 in the direction of the head side so that the cable connection 10 is always tensioned tightly.

The remaining structure corresponds to that known from FIGS. 1A and 1B, except that here the cable connection 10 is fed directly through the guides 17'.

Figure 3A:
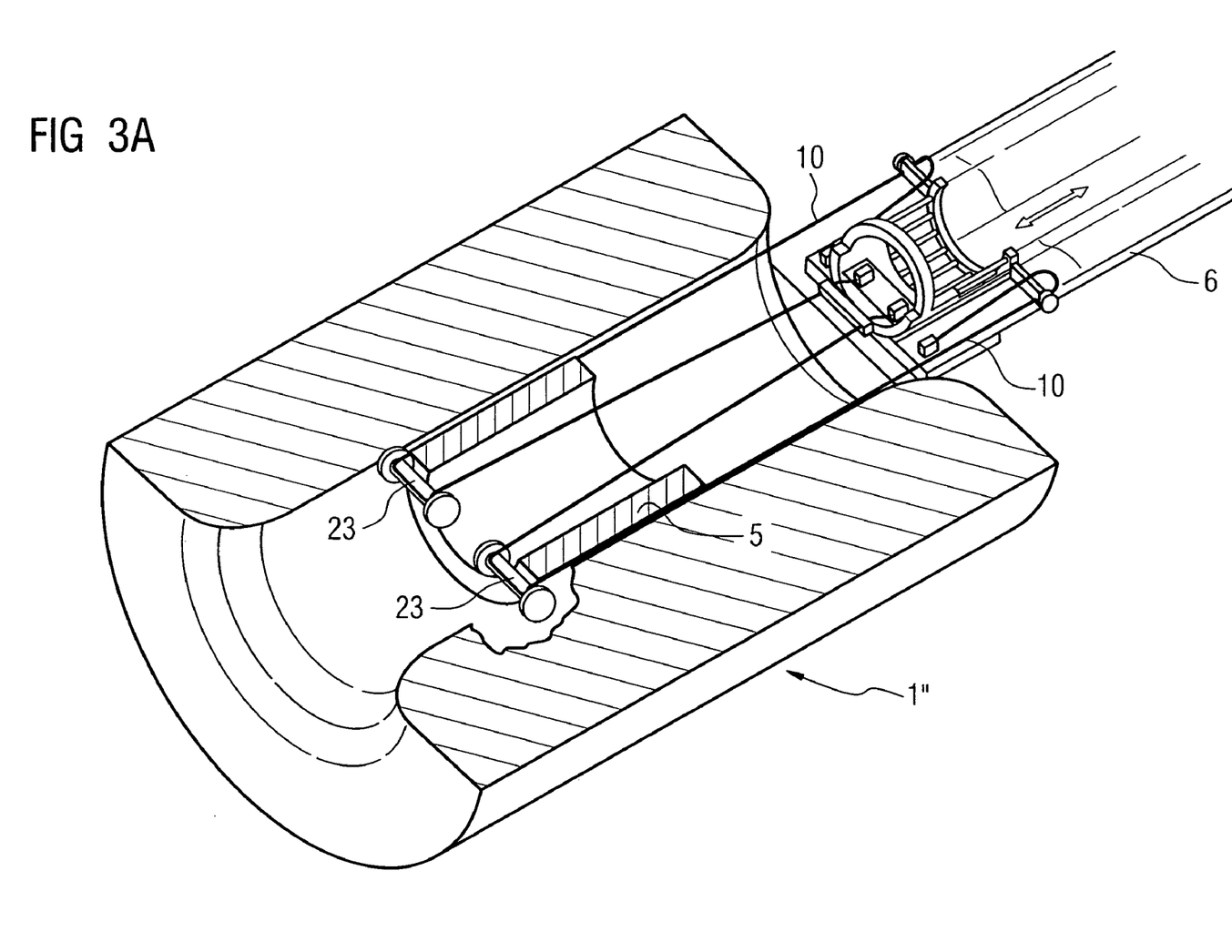
FIGS. 3A and 3B show an outline sketch which shows a section through a magnetic resonance instrument according to a third embodiment, respectively with the patient support extracted and inserted.
Figure 3B:
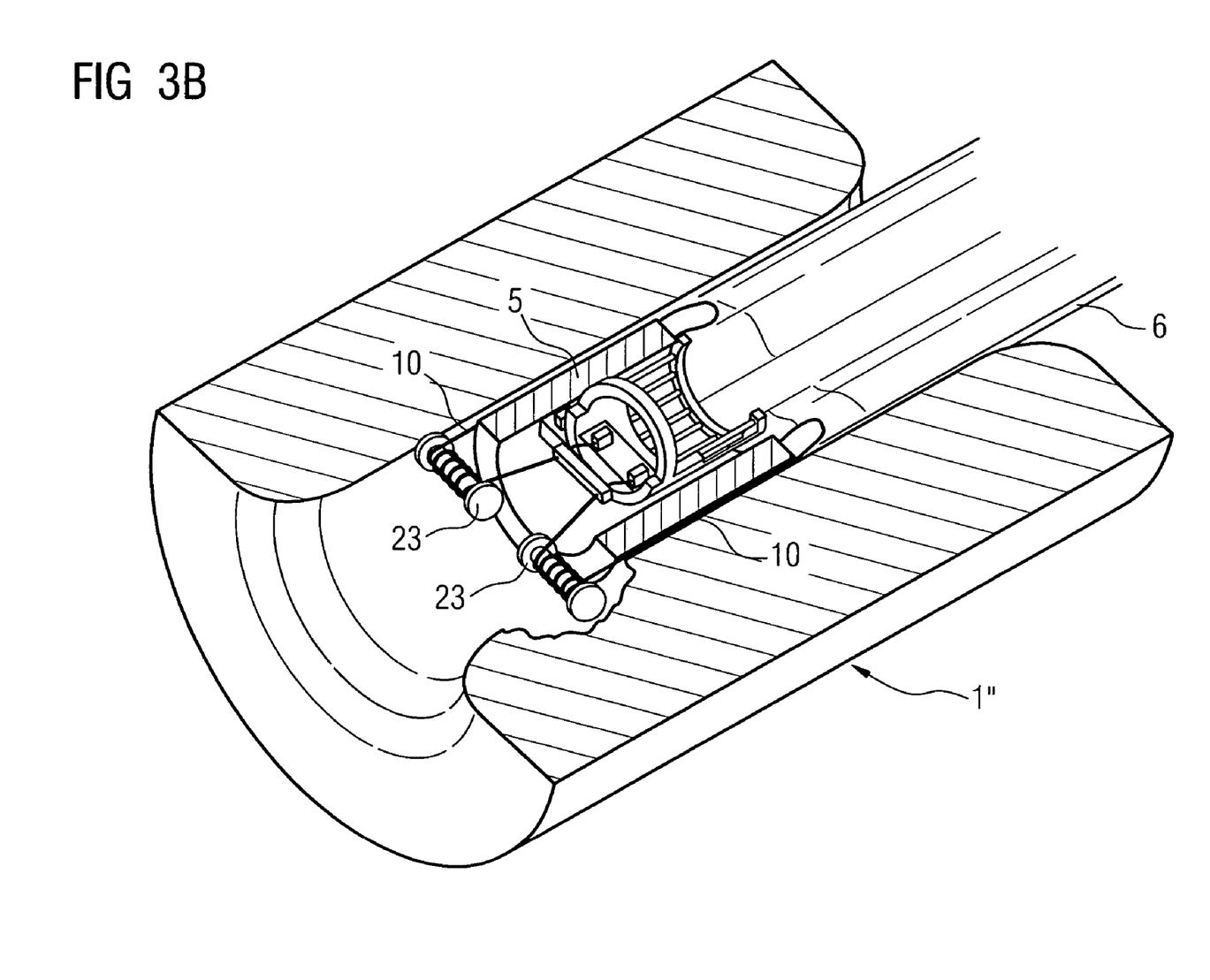

Another embodiment of a magnetic resonance system 1" is shown by FIGS. 3A and 3B. A cable drum 23, preloaded against a restoring force, on which the cable connection 10 which is fastened on it at the reverse bend is rolled up automatically owing to the preloading, is fastened on the PET detector 5 here.

As an alternative, it is of course also possible to fasten the cable drum 23 on the cladding 3 of the magnet 2.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A connection device configured for connecting electronics of a head coil compatible with a magnetic resonance system and arranged on a patient support of an imaging system to a connector location provided on the patient support, the head coil being insertable into a PET detector arranged in a magnetic resonance instrument of the imaging system in order to enable simultaneous magnetic resonance and PET recording, the connection device comprising:
a cable connection including at least one releasable attachment device that attaches the electronics and the connector location, the cable connection being situated from the electronics through the annular PET detector and externally on the PET detector back to the connector location.

2. The connection device as claimed in claim 1, further comprising at least one guide device between the electronics and the connector location configured to establish a route of the cable connection.

3. The connection device as claimed in claim 1, wherein the guide device is tubular and at least partially encloses the cable connection.

4. The connection device as claimed in claim 2, further comprising at least one telescopable carrier element connected to the at least one of the guide device and the cable connection, the at least one carrier element being configured to hold the at least one guide device and the cable connection.

5. The connection device as claimed in claim 2, wherein the cable connection is fed over at least one pulley attached to a carrier element, the carrier element connected to a releasable device mounted in the head coil in a turnaround region defined by a reverse bend in the at least one guide device.

6. The connection device as claimed in claim 2, wherein the cable connection includes at least two subsections parallel to a longitudinal axis of the PET detector, the at least two subsections configured so that the subsections are fed along the PET detector when the patient support is moved along a patient carriage.

7. The connection device as claimed in claim 6, wherein a length of the subsections is a function of a maximum movement range of the patient support.

8. The connection device as claimed in claim 2, wherein at least one pulley is provided on a carrier element at a head-side end of the PET detector for receiving and feeding the cable connection in a direction essentially perpendicular to a longitudinal axis of the PET detector.

9. The connection device as claimed in claim 1, wherein at least one stationary cable drum is provided at a head side end of the PET detector and configured for at least one of receiving and releasing the cable connection when the patient support is moved.

10. An annular PET detector comprising at least one connection device as claimed in claim 1.

11. The PET detector as claimed in claim 10, wherein at least one of the cable connections and at least one guide device are fed in at least one of a static and a sliding fashion between the electronics and the connector location, the at least one guide device being fastened on at least one of an outer and inner surface of the PET detector.

12. The PET detector as claimed in claim 10, wherein at least one stationary cable drum is provided on the end side of the PET detector and configured for at least one of receiving and releasing the cable connection when the patient support is moved.

13. A magnetic resonance system comprising:
a magnet;
a patient support, movable into a patient compartment; and
a PET detector as claimed in claim 10, fastened in the patient compartment.

14. The magnetic resonance system as claimed in claim 13, wherein at least one stationary cable drum is provided on a cladding of the magnet configured for receiving or releasing the cable connection when the patient support is moved.

15. The magnetic resonance system as claimed in claim 13, wherein the patient support includes a patient table, and a cable carriage, the patient table being movable relative to a table carriage, a local coil being fastenable on the patient table and a connector location being provided on the table carriage, the cable connection including a loop in the region of the connector location in order to compensate for movements of the patient table relative to the carriage.

16. The connection device as claimed in claim 3, further comprising at least one telescopable carrier element connected to the head coil and the PET detector and configured to hold at least one of the guide device and the cable connection.

17. A connection device configured for connecting electronics of a head coil compatible with a magnetic resonance system and arranged on a patient support in a connector location provided on the patient support, the head coil being insertable into a PET detector arranged in a magnetic resonance instrument in order to enable simultaneous magnetic resonance and PET recording, the connection device comprising:
a cable connection including at least one releasable device configured to attach the electronics and the connector location, the cable connection being attached to the electronics at a first end, the cable connection including a portion that passes through an interior of the PET detector and a portion that passes externally on the PET detector wherein the cable connection is attached to the connector location at a second end.

18. The connection device as claimed in claim 17, further comprising at least one guide device, between the PET detector and the head coil in order to establish a route of the cable connection.

19. The connection device as claimed in claim 17, wherein the at least one guide device is tubular and at least partially encloses the cable connection.

20. The connection device as claimed in claim 18, further comprising at least one telescopable carrier element between the head coil and the PET detector, the at least one telescopable carrier element configured to hold at least one of the guide devices and the cable connection.

21. An annular PET detector comprising at least one connection device as claimed in claim 17.

22. A magnetic resonance system comprising:
a magnet;
a patient support, movable into a patient compartment of the magnetic resonance system; and
a PET detector as claimed in claim 21, fastened in the patient compartment.

* * * * *